United States Patent [19]

Iwamura

[11] Patent Number: 5,541,937
[45] Date of Patent: Jul. 30, 1996

[54] APPARATUS FOR UNIFORMLY CORRECTING ERASURE AND ERROR OF RECEIVED WORD BY USING A COMMON POLYNOMIAL

[75] Inventor: Keiichi Iwamura, Kawasaki, Japan

[73] Assignee: Canon Kabushiki Kaisha, Tokyo, Japan

[21] Appl. No.: 362,989

[22] Filed: Dec. 23, 1994

[30] Foreign Application Priority Data

Dec. 27, 1993 [JP] Japan .................................. 5-348569

[51] Int. Cl.$^6$ ............................................. H03M 13/00
[52] U.S. Cl. ....................................................... 371/37.1
[58] Field of Search ............................. 371/37.1, 37.2, 371/37.4, 37.6, 38.1, 39.1, 40.1

[56] References Cited

U.S. PATENT DOCUMENTS

| | | | |
|---|---|---|---|
| 4,162,480 | 7/1979 | Berlekamp | 371/37.1 |
| 4,649,541 | 3/1987 | Lahmeyer | 371/37.1 |
| 4,719,628 | 1/1988 | Ozaki et al. | 371/37.4 |
| 4,747,103 | 5/1988 | Iwamura et al. | 371/37.4 |
| 4,751,704 | 6/1988 | Kojima | 371/37.2 |
| 4,852,099 | 7/1989 | Ozaki | 371/37.5 |
| 4,873,688 | 10/1989 | Maki et al. | 371/37.1 |
| 5,325,373 | 6/1994 | Iwamura et al. | 371/37.1 |
| 5,365,529 | 11/1994 | Mester | 371/37.1 |

FOREIGN PATENT DOCUMENTS

| | | |
|---|---|---|
| 0167627 | 1/1986 | European Pat. Off. |
| 0278383 | 8/1988 | European Pat. Off. |
| 0296828 | 12/1988 | European Pat. Off. |
| 2673341 | 8/1992 | France |
| 63-233613 | 9/1988 | Japan |
| 63-233614 | 9/1988 | Japan |

*Primary Examiner*—Roy N. Envall, Jr.
*Assistant Examiner*—Emmanuel L. Moise
*Attorney, Agent, or Firm*—Fitzpatrick, Cella, Harper & Scinto

[57] ABSTRACT

A syndrome polynomial $S(x)$ is generated based on a received word, an erasure locator polynomial $\lambda(x)$ is generated based on an erasure location, an error evaluator polynomial $\omega(x)$ is generated based on a polynomial $M(x)$ which is a product $S(x)\cdot\lambda(x)$ of the syndrome polynomial $S(x)$ and the erasure locator polynomial $\lambda(x)$, a polynomial $\tau(x)$ which is a product $\lambda(x)\cdot\sigma(x)$ of the erasure locator polynomial $\lambda(x)$ and the error locator polynomial $\sigma(x)$ and a differentiation $\tau'(x)$ of the polynomial $\tau(x)$ based on the polynomial $M(x)$ and the erasure locator polynomial $\lambda(x)$, a dimension $\alpha^i$ is set to the error evaluator polynomial $\omega(x)$, the polynomial $\tau(x)$ and the differentiation $\tau'(x)$, and when $\tau(\alpha^i)=0$, the i-th symbol of the received word is corrected to $\omega(\alpha^i)/\tau'(\alpha^i)$.

8 Claims, 11 Drawing Sheets

APPARATUS FOR UNIFORMLY CORRECTING ERASURE AND ERROR OF RECEIVED WORD BY USING A COMMON POLYNOMIAL

BACKGROUND OF THE INVENTION

1. Field of the Invention

The present invention relates to an apparatus for correcting an error occurred in a communication path in a digital communication system or a recording medium in a digital recording system, at a receiving or reading station.

2. Related Background Art

In the digital communication system and the digital recording system, an error correcting code has been used to correct an error occurred in the communication path or the recording medium at the receiving station. As such an error correcting code, Reed-Solomon code (RS code) and BCH code have been well known. Those codes are widely utilized in an optical disk and a satellite communication and encoder and decoder therefor have been implemented in the form of IC.

Recently, a decoder having a high error correcting capability at a high speed is demanded and various proposals have been made to meet this demand. Before explaining the proposals specifically, assuming that an RS code is used as an error correcting code, a formula expressing a received word $R(x)$ is first explained. The following generator polynomial is used:

$$G(x) = \prod_{i=b}^{b+d-2} (x - \alpha^i) \quad (1)$$

where m (a positive integer) represents a bit length of one symbol, $n \leq 2^{m-1}$ represents a code length, $k=n-(d-1)$ represents an information length and d represents a minimum distance.

For simplicity, it is assumed that b=0 in the formula (1), the code is defined on a Galois field $GF(2^m)$ and a primitive element thereof is at $\alpha$. The encoding is carried out by the following operation.

A check polynomial $P(x)$ is generated from the following polynomial $I(x)$ having coefficients represented by an information string $\{I_{k-1}, I_{k-2}, \ldots, I_0\}$ and the generator polynomial $G(x)$ of the formula (1):

$$I(x) = \sum_{i=1}^{k} I_{k-i} \cdot X^{k-i} \quad (2)$$

$$P(x) = I(x) \cdot X^{d-1} \bmod G(x) \quad (3)$$

A code word $C(x)$ transmitted is represented by:

$$C(x) = I(x) \cdot X^{d-1} + P(x) \quad (4)$$

where in the formula (4) deg $P(x) < n-k$ represents an order of $P(x)$ and a coefficient of $P(x)$ gives a check digit.

It is assumed that when the code word represented by the formula (4) is transmitted, an error $E(x)$ is added in a communication path and a received word $R(x)$ represented by the following formula (5) is received at a receiving station, wherein the coefficients of $E(x)$ are also represented by the Galois field $GF(2^m)$ and are zero if there is no error.

$$R(x) = C(x) + E(x) \quad (5)$$

Figure 7:
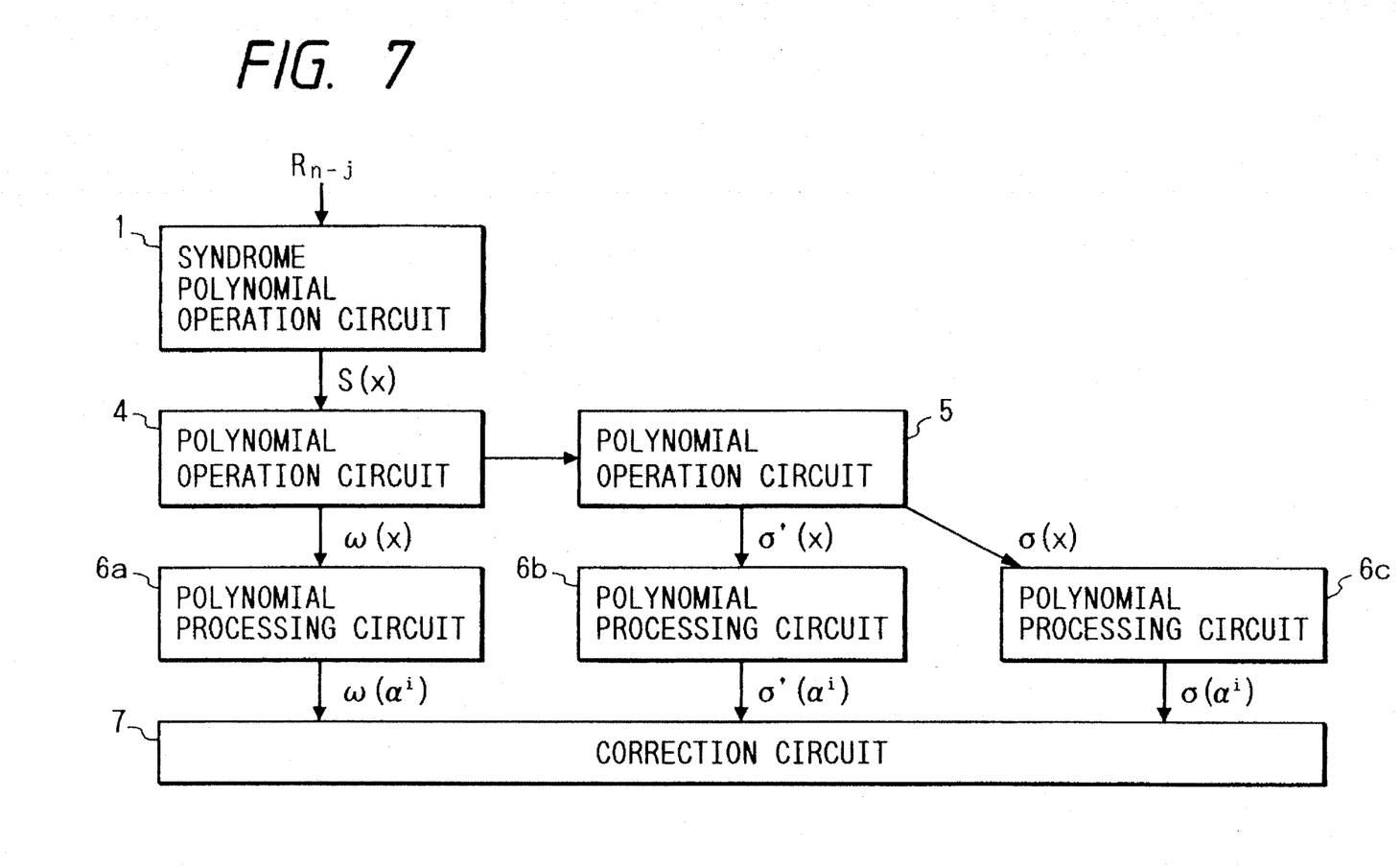
FIG. 7 shows a block diagram of a configuration of a prior art error correction apparatus.

Various methods have been proposed as a decoding method for the received word $R(x)$ of the RS code, and U.S. Pat. No. 4,873,688 discloses a decoder having a configuration principle as shown in FIG. 7. In this decoder, a received word $R_{n-j}$ is inputted to a syndrome polynomial operation circuit 1, which operates a syndrome polynomial $S(x)$ by the following formula (6).

$$S(x) = \sum_{k=1}^{d-1} S_{k-1} \cdot X^{k-1} \quad (6)$$

where $$S_{k-1} = \sum_{i=1}^{n} R_{n-i} \cdot (\alpha^k)^{n-i} \quad (7)$$

The syndrome polynomial $S(x)$ is inputted to polynomial operation circuits 4 and 5 and an error locator polynomial $\sigma(x)$ and a differentiation thereof $\sigma'(x)$ and an error evaluator polynomial $\omega(x)$ are determined in the course of an operation of an Euclidean algorithm. Then, the error locator polynomial $\sigma(x)$, the differentiation thereof $\alpha'(x)$ and the error evaluator polynomial $\omega(x)$ are inputted to polynomial processing circuits 6a–6c where x is set to $\alpha^i$ and the formulas thus processed are inputted to a correction circuit 7.

In the correction circuit 7, if the error locator polynomial $\sigma(\alpha^i)$ is 0, it is determined that an error has occurred in an i-th symbol $R_i$ of the received word and the error evaluator $e_i$ is calculated by the following formula:

$$e_i = \omega(\alpha^i)/\sigma'(\alpha^i) \quad (8)$$

Figure 8:
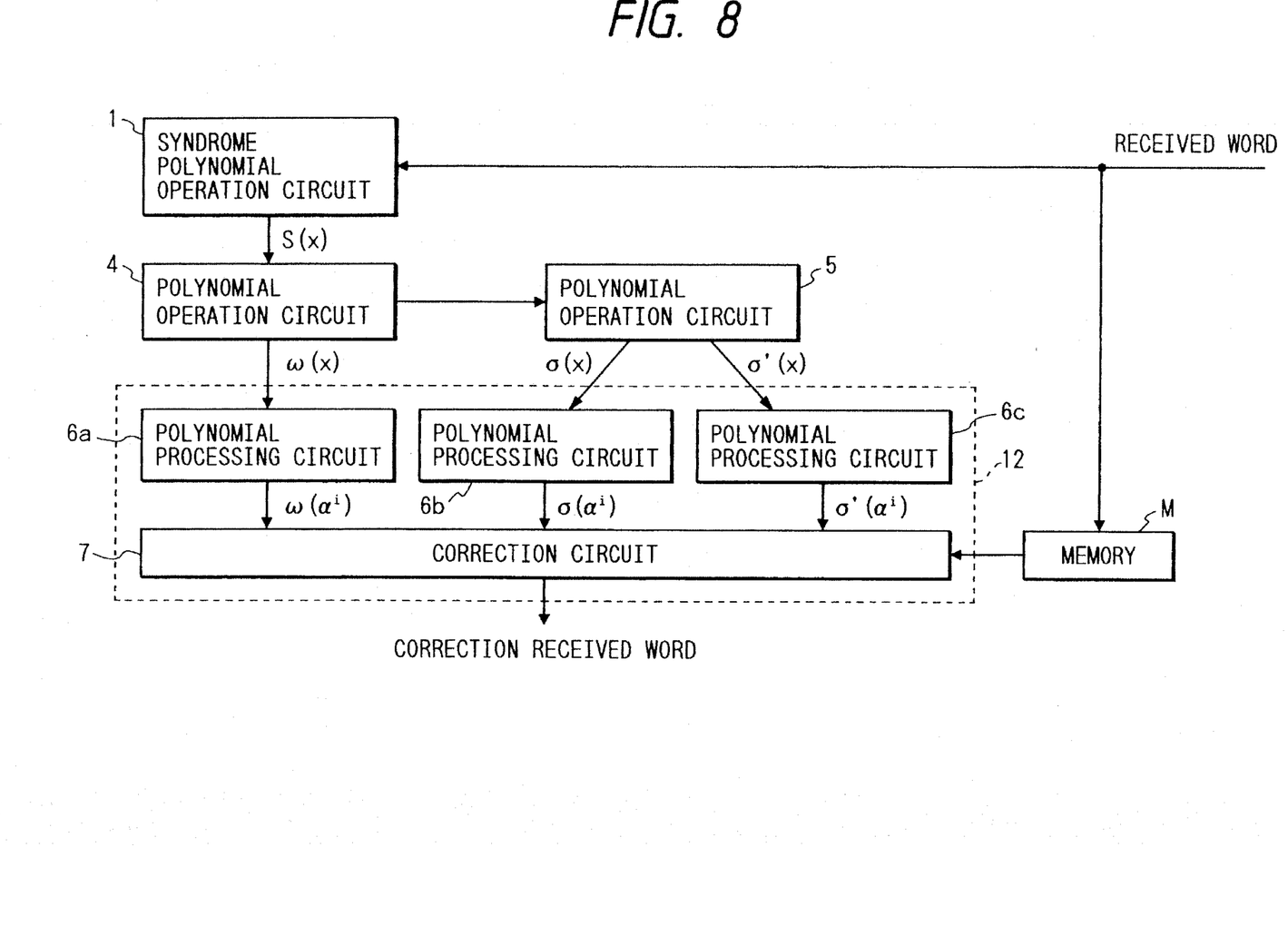
FIG. 8 shows a block diagram of a configuration of a prior art error correction apparatus.
Figure 9:
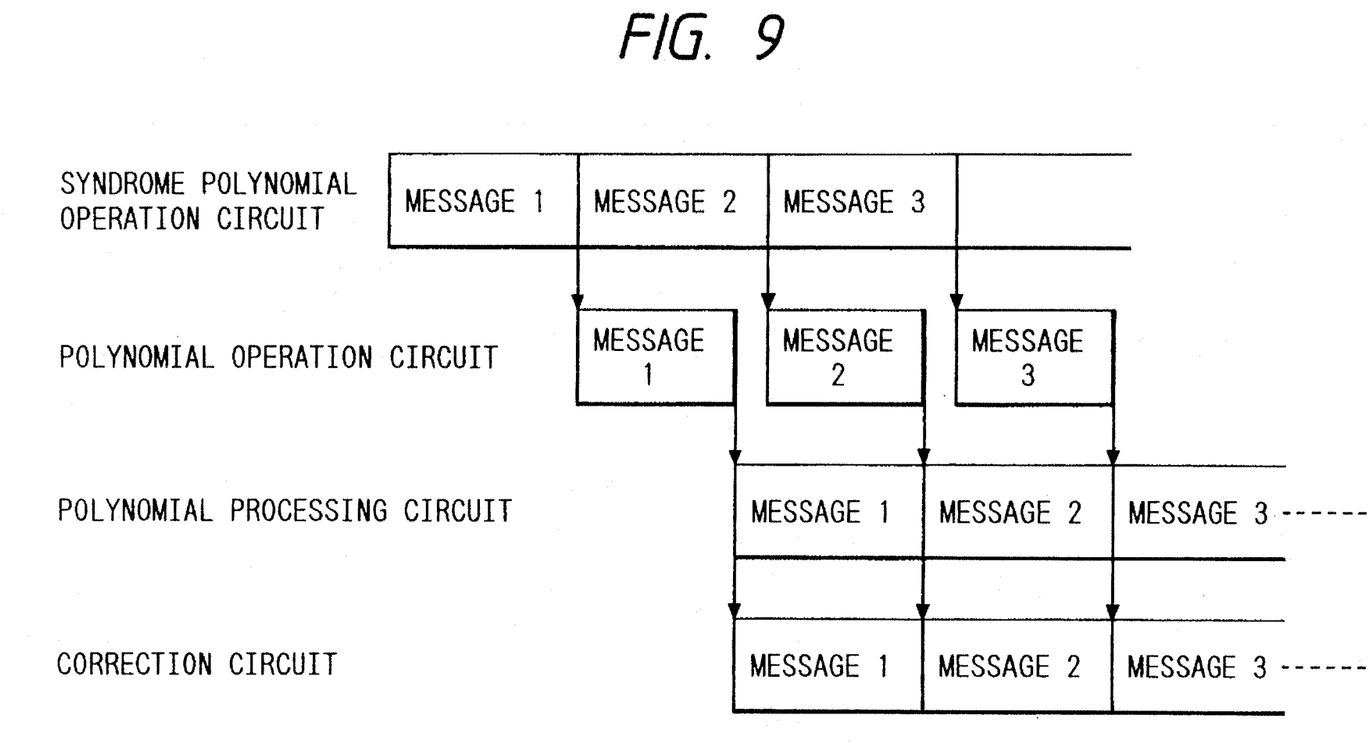
FIG. 9 illustrates an operation of the prior art error correction apparatus.

In FIG. 7, since the processing in the polynomial operation circuits 4 and 5 and the processing in the polynomial processing circuits 6a–6c can be concurrently carried out, pipeline processing is carried out for the continuously transmitted received words (messages 1, 2, 3, . . . ) as shown in FIG. 9. In actual, a memory M is provided as shown in FIG. 8 and it receives the received word in synchronism with the processing of the syndrome polynomial operation circuit 1 and outputs it in synchronism with the processing of the correction circuit 7 to carry out the decoding at a high speed on real time basis.

In this manner, if the error locator polynomial $\sigma(\alpha^i)$ is 0, it is assumed that an error has occurred in the i-th symbol $R_i$ of the received word and a correction value $p_i = e_i$ is added to the symbol $R_i$ to correct the i-th symbol $R_i$ of the received word.

In the proposed decoder, 16 errors can be corrected at a rate of 80M bits/sec (bps) on real time basis but it cannot carry out erasure correction.

Figure 10:
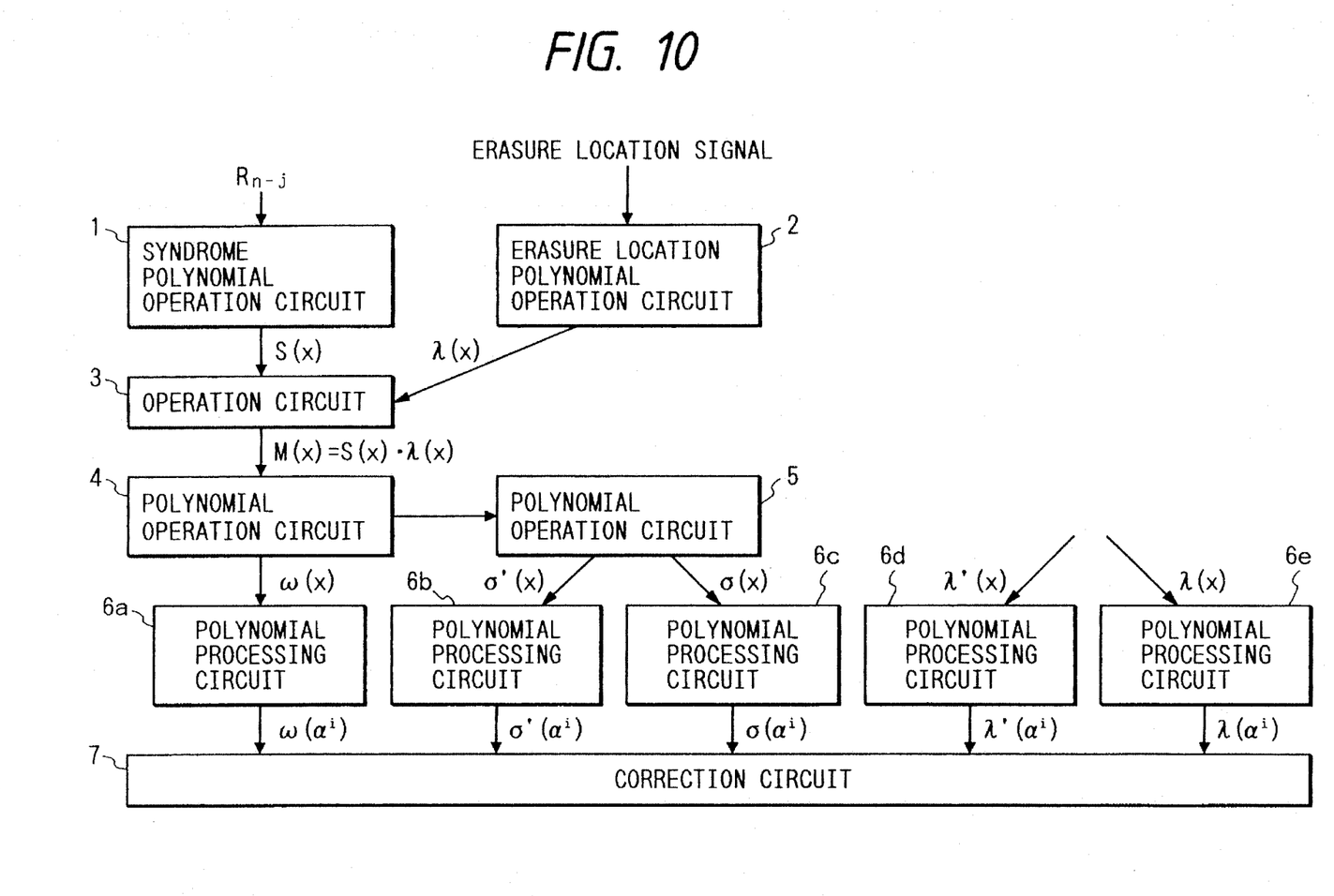
FIG. 10 shows a block diagram of a configuration of a prior art erasure correctable error correction apparatus.

On the other hand, the inventor of the present invention have proposed a decoder for carrying out the decoding operation including the erasure correction (U.S. Pat. No. 5,325,373) and FIG. 10 shows a block diagram of a configuration principle of the proposal.

In the proposed decode, an erasure locator polynomial operation circuit 2 and a product polynomial operation circuit 3 are newly provided, and in the erasure locator polynomial operation circuit 2, an erasure location polynomial $\lambda(x)$ shown by the following formula (9) is calculated:

$$\lambda(x) = \prod_{i=1}^{s} (1 - Y_i x) \quad (9)$$

where $Y(i) = \alpha^{ji}$ (i=1, 2, . . . , s) for s erasure locations $j_1, j_2, \ldots j_s$.

In this case, it is assumed that s erasures occur at locations $j_1, j_2, \ldots j_s$ in the received word $R(x)$, r errors occurs in addition to the erasure at locations $k_1, k_2, \ldots k_r$, and the decoder is aware of the erasure locations $j_1, j_2, \ldots j_s$ but unaware of the error locations $k_1, k_2, \ldots k_r$. It is assumed that the erasure is indicated by a flag and a symbol of the erasure location is a dimension on the Galois field $GF(2^m)$ as other locations are. It is also assumed that $2t+s+1 \leq d$ (where t represents the number of correctable errors and $t \geq r$) is met.

The syndrome polynomial $S(x)$ calculated by the syndrome polynmial operation circuit 1 and the erasure locator polynomial $\lambda(x)$ are inputted to the product polynomial operation circuit 3 in the same manner as in the decoder of FIG. 7, and in the product polynomial operation circuit 3, the product polynomial $M(x)=S(x)\cdot\lambda(x)$ of the syndrome polynomial $S(x)$ and the erasure locator polynomial $\lambda(x)$ is calcuated. The product polynomial $M(x)=S(x)\cdot\lambda(x)$ is then inputted to the polynomial operation circuit 4, and in the polynomial operation circuits 4 and 5, an error locator polynomial $\sigma(x)$ and an error evaluator polynomial $\omega$ which meet the following formulas (10) and (11) are calculated for the polynomial $x^{d-1}$ and the product polynomial $M(x)$:

$$\deg \omega(x) < t+s, \deg \sigma(x) \leq t \quad (10)$$

$$A(x) \cdot X^{d-1} + \sigma(x) \cdot M(x) = \omega(x) \quad (11)$$

where $A(x)$ is a polynomial on the $GF(2^m)$.

The error evaluator polynomial $\omega(x)$ and the error locator polynomial $\sigma(x)$ which meet the formulas (10) and (11) are determined by separate processing in the course of the Euclidean algorithm to determine a greatest common divisor polynomial (GCD) of $x^{d-1}$ and $M(x)$.

Then, the error evaluator polynomial $\omega(x)$, the error locator polynomial $\sigma(x)$, the differentiation $\sigma'(x)$ of the error locator polynomial $\sigma(x)$, the erasure locator polynomial $\lambda(x)$ and the differentiation $\lambda'(x)$ of the erasure locator polynomial $\lambda(x)$ are inputted to the polynomial processing circuits 6a–6e and x is set to $\alpha^i$ (i=−n+1, ... , 0) in those formulas. The error evaluator polynomial $\omega(\alpha^i)$, the error locator polynomial $\sigma(\alpha^i)$, the differentiation $\sigma'(\alpha^i)$ of the error locator polynomial $\sigma(x)$, the erasure locator polynomial $\lambda(\alpha^i)$ and the differentiation $\lambda'(\alpha^i)$ of the erasure locator polynomial $\alpha(x)$ are inputted to the correction circuit 7.

In the correction circuit 7, if the error locator polynomial $\sigma(\alpha^i)$ is 0, it is determined that an error occurred in the i-th symbol $R_i$ of the received word and the error $e_i$ is calculated by the following formula (12) and an erasure value $E_i$ at the erasure location is calculated by the following formula (13):

$$e_i = \omega(\alpha^i) / \{\sigma'(\alpha^i) \cdot \lambda(\alpha^i)\} \quad (12)$$

$$E_i = \omega(\alpha^i) / \{\lambda'(\alpha^i) \cdot \sigma(\alpha^i)\} \quad (13)$$

In this manner, the correction value $p_i$ is added to the i-th symbol $R_i$ of the received word determined to have the error to correct the error and fill the erasure in order to correct the received word where the correction value is represented by:

$p_i=e_i$; when the error locator polynomial $\sigma(\alpha^i)$ is 0 (14a)

$p_i=E_i$; when erasure location (14b)

$p_i=0$; other cases (14c)

In this manner, the decoding operation including the erasure correction can be carried out by the decoder previously proposed by the present inventors.

The proposed decoder can carry out the decoding operation including the erasure correction but a circuit scale of the decoder and a processing time increase and the high speed real time processing as disclosed in U.S. Pat. No. 4,873,688 is difficult to attain.

SUMMARY OF THE INVENTION

It is an object of the present invention to correct the erasure and the error at a high speed.

It is another object of the present invention to unify the processing by calculating the erasure location and value and the error location and value by using a common polynomial to simplify a circuit for the erasure correction and error correction to attain high speed processing.

According to one aspect, the present invention which achieves these objects relates to an apparatus for correcting erasure and error of a received word comprising: syndrome polynomial generation means for generating a syndrome polynomial based on the received word; erasure locator polynomial generation means for generating an erasure locator polynomial based on an erasure location; first product polynomial generation means for generating a first product polynomial which is a product of the syndrome polynomial and the erasure locator polynomial; error evaluator polynomial generation means for generating an error evaluator polynomial based on the first product polynomial; second product polynomial generation means for generating a second product polynomial which is a product of the erasure locator polynomial and the error locator polynomial and a differentiation of the second product polynomial; first numeric operation means for producing the value of differentiation of the second product polynomial with a specific dimension; second operation means for producing a value of the error evaluator polynomial with a specific dimension; third operation means for producing a value of the second product polynomial with a specific dimension; fourth numeric operation means for dividing the operation result of the first numeric operation means by the operation result of the second numeric operation means; determination means for determining whether the operation result of the third numeric operation means is a predetermined value; and correction means for setting the dimension corresponding to the location of the symbols of the received word to the first to third numeric operation means, and when the predetermined value is detected by the determination means, correcting the corresponding symbol by using the operation result of the fourth numeric operation unit.

Other objectives and advantages besides those discussed above shall be apparent to those skilled in the art from the description of preferred embodiments of the invention which follow. In the description, reference is made to the accompanying drawings, which from a part thereof, and which illustrate examples of the invention. Such examples, however, are not exhaustive of various embodiments of the invention, and therefore reference is made to the claims which follow the description for determining the scope of the invention.

DETAILED DESCRIPTION OF THE PREFERRED EMBODIMENTS

Preferred embodiments of this invention will now be described in detail with reference to the accompanying drawings.

[First Embodiment]

Figure 1:
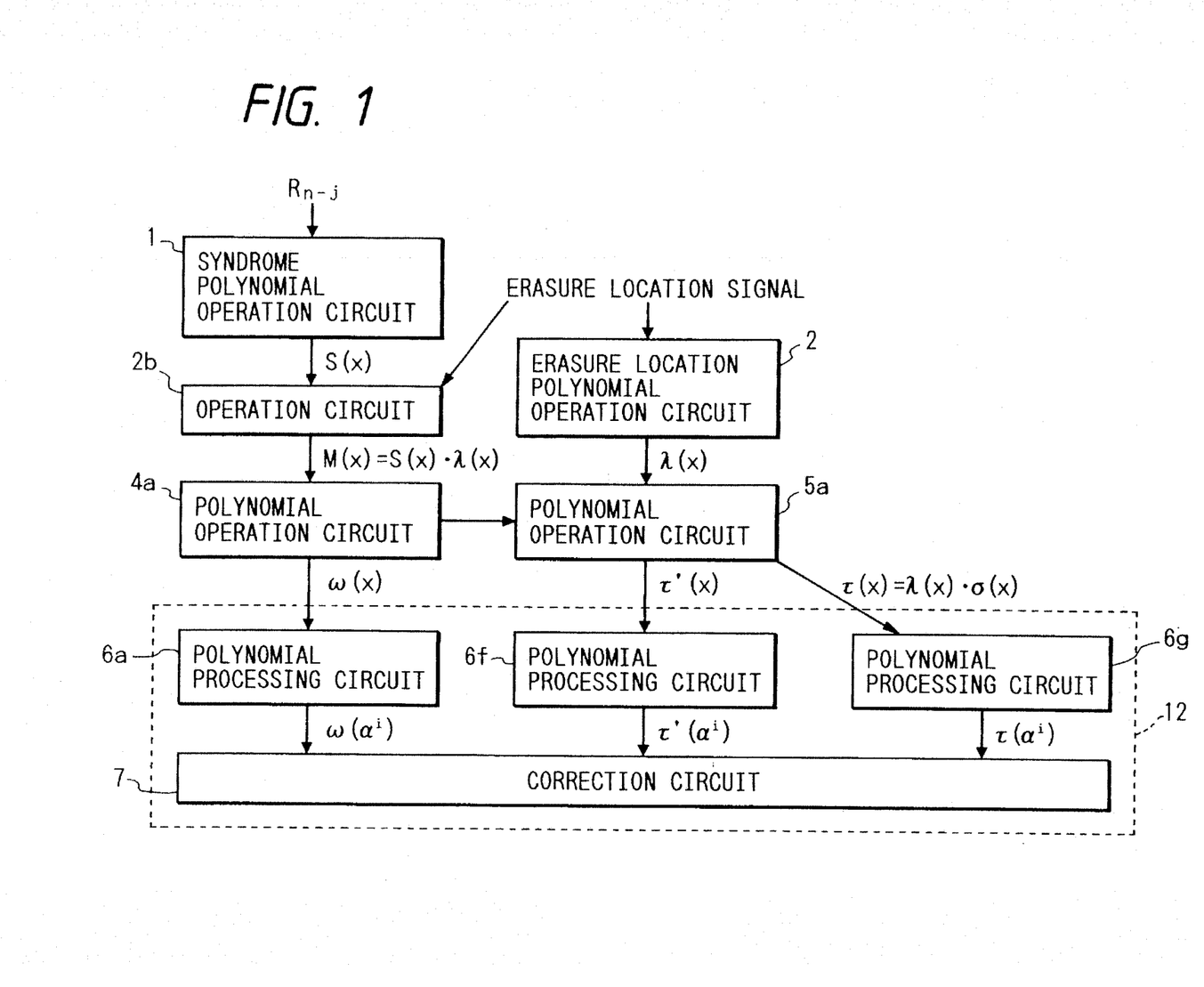
FIG. 1 shows a block diagram of a configuration of an error correction apparatus of a first embodiment.
Figure 2:
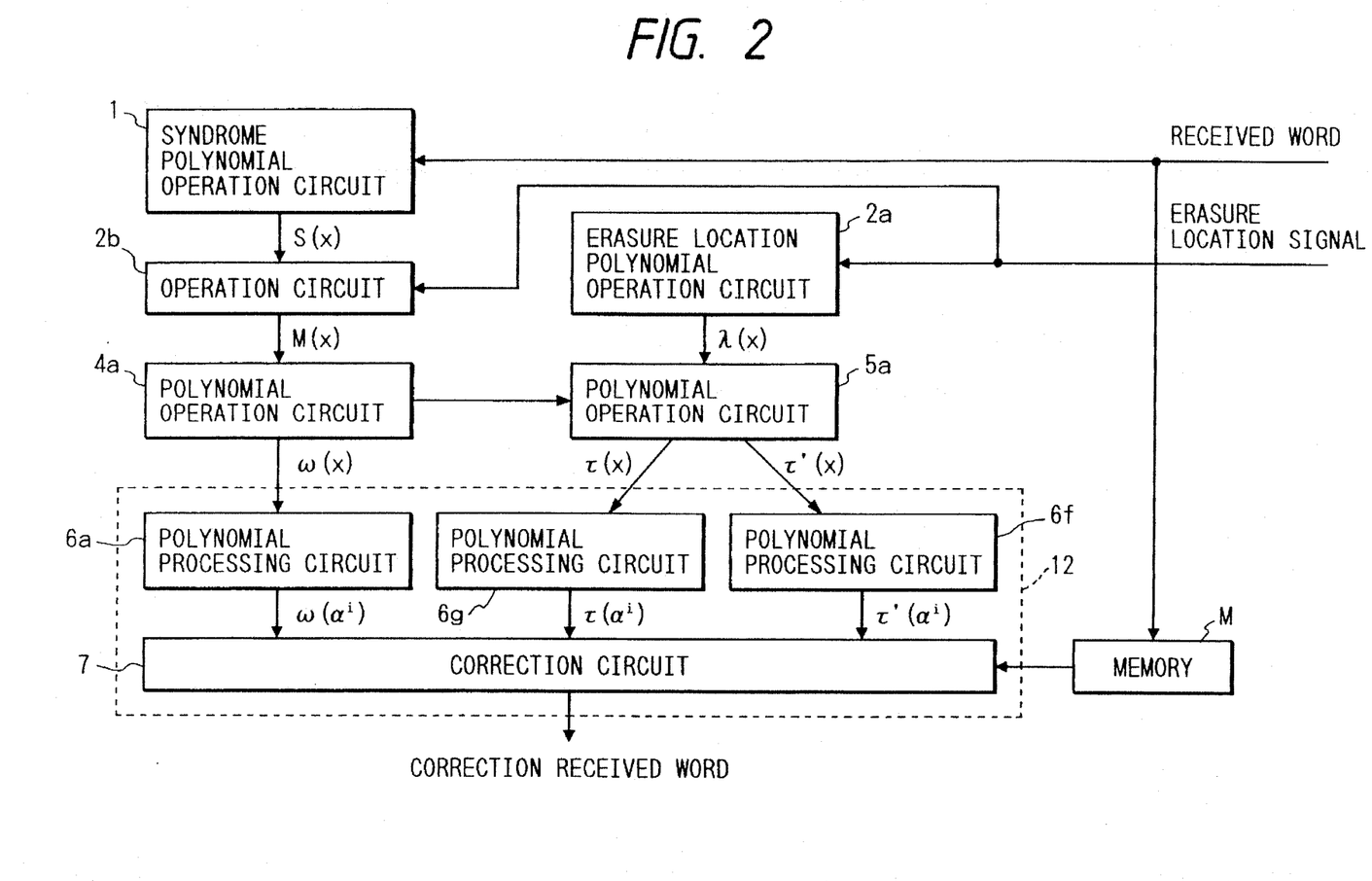
FIG. 2 shows a block diagram of a configuration of the error correction apparatus of the first embodiment, FIG. 3 show a block diagram of a correction circuit.
Figure 3:
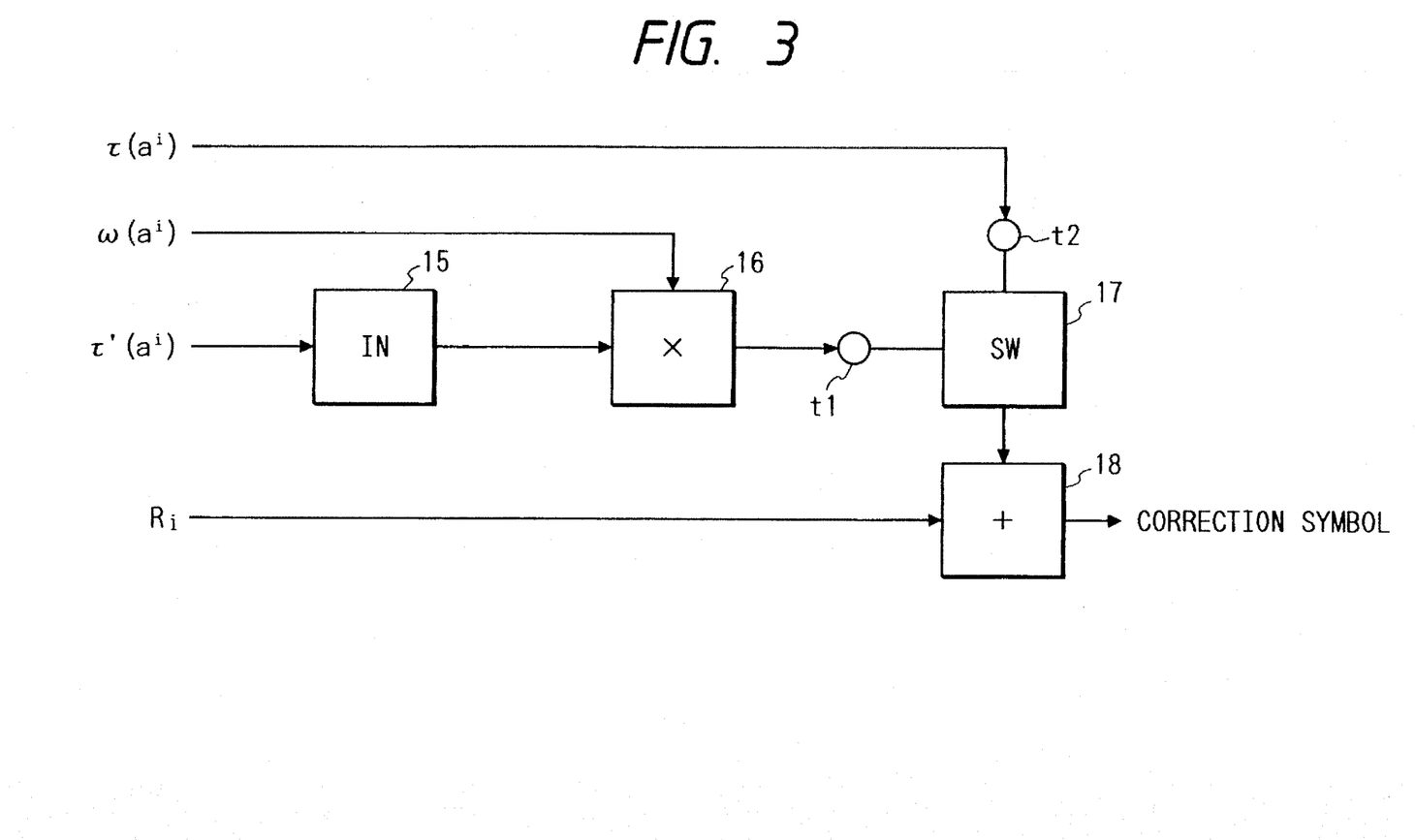
Figure 4:
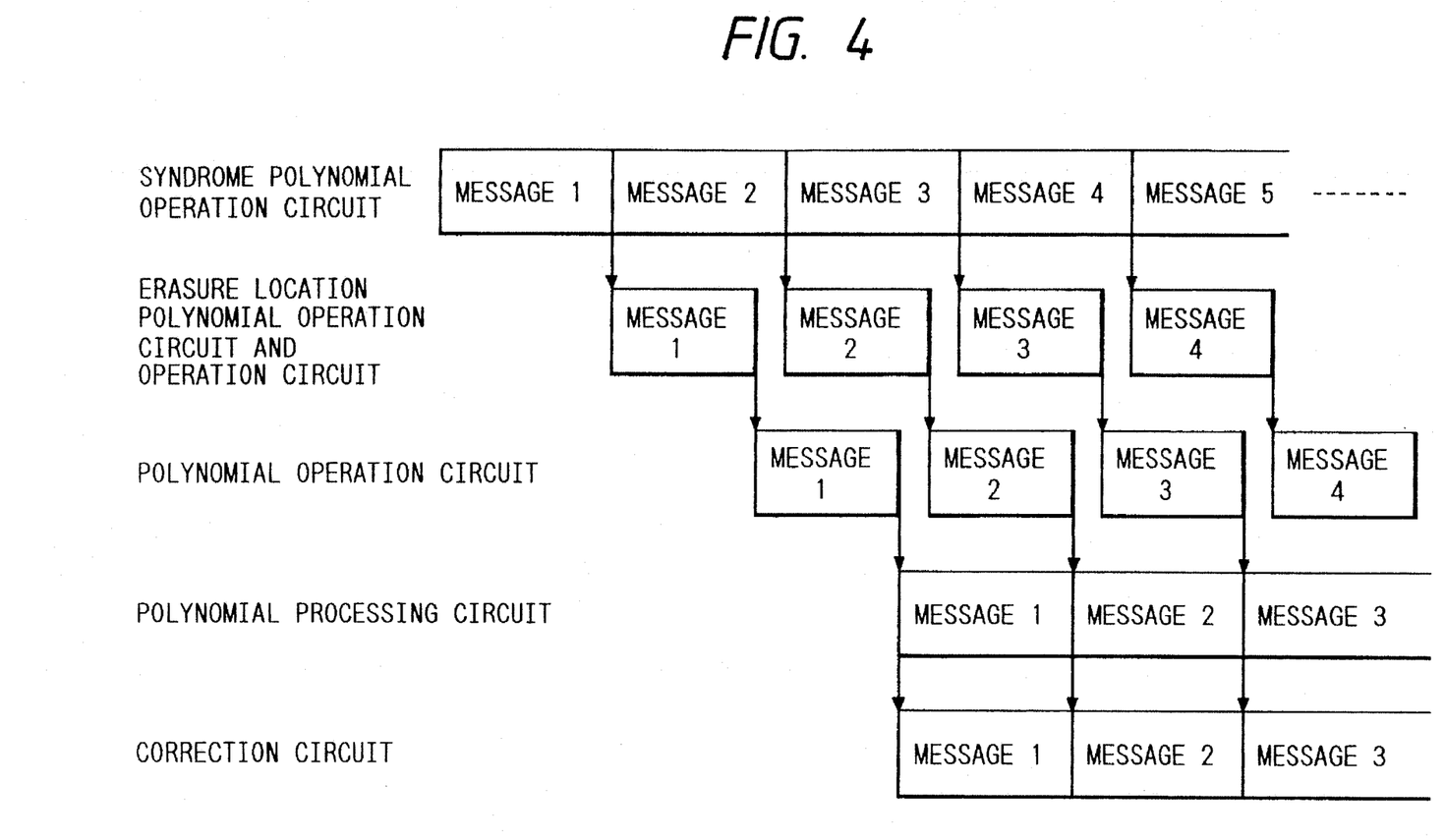
FIG. 4 illustrates an operation of the first embodiment.

Referring to FIGS. 1 to 4, a first embodiment of the present invention is explained. FIG. 1 shows a block diagram of a configuration principle of a decoder of the present embodiment, FIG. 2 shows a block diagram of a configuration of the decoder of the present embodiment, FIG. 3 shows a block diagram of a main portion of a correction circuit 7 of the present embodiment, and FIG. 4 illustrates an operation of the decoder of the present embodiment.

In the present embodiment, the product polynomial operation circuit 3 is eliminated from the decoder shown in FIG. 10, and an operation circuit 2b of the same configuration as that of the erasure locator polynomial operation circuit 2 is provided in place of the product polynomial operation circuit 3. The polynomial operation circuits 4a and 5a operate an error evaluator polynomial $\omega(x)$, a newly defined error and erasure locator polynomial $\tau(x)=\lambda(x)\cdot\sigma(x)$ and a differentiation $\tau'(x)$ of the error and erasure locator polynomial $\tau(x)$ in the Euclidean algorithm. In the present embodiment, since the polynomial processing circuit of the correction circuit 12 operates the error evaluator polynomial $\omega(x)$, the error and erasure locator polynomial $\tau(x)=\lambda(x)\cdot\sigma(x)$ and the differentiation $\tau'(x)$ of the error and erasure locator polynomial $\tau(x)$, three error evaluator polynomials 6a, 6f and 6g are provided. The correction circuit 7 of the correction circuit 12 has a function to calculate the error value and the erasure value based on the error evaluator polynomial $\omega(x)$, the error and erasure locator polynomial $\tau(x)=\lambda(x)\cdot\sigma(x)$ and the differentiation $\tau'(x)$ of the error and erasure locator polynomial $\tau(x)$ to carry out the correction. The configuration of other portions of the present embodiment is identical to that of the decoder of FIG. 10 described above.

In the erasure locator polynomial operation circuit 2, the processing of $\lambda_i(x)=\lambda_{i-1}(x)\cdot(1-Y_i x)$ with an initial $\lambda(x)$ being $\lambda_0(x)$ is repeated for i=1, . . . , s to determine the erasure locator polynomial $\lambda_s(x)$. Accordingly, when the initial value for $\lambda(x)$ is $\lambda_0(x)=S(x)$, $\lambda(x)=S(x)\cdot\lambda_s(x)=M(x)$ is derived. Accordingly, by proving the operation circuit 2b of the same configuration as that of the erasure locator polynomial operation circuit 2 and changing the initial value from 1 to S(x), the product polynomial M(x) can be calculated.

In the Euclidean algorithm conducted in the polynomial operation circuits 4a and 5a, operations of the following formulas (15) and (16) are repeated until deg $\omega_e(x)<t$ is met, with the initial value of $$\omega_{-1}(x) = X^{d-1} \qquad \omega_0(x) = M(x) \qquad (15)$$
$$\sigma_{-1}(x) = 0 \qquad \sigma_0(x) = 1$$
$$\omega_i(x) = q_i \cdot \omega_{i-1}(x) + \omega_{i-2}(x) \ (\deg \omega_{i-1} > \deg \omega_i)$$

$$\sigma_i(x) = q_i \cdot \sigma_{i-1}(x) + \sigma_{i-2} \qquad (16)$$

In this case, the error locator polynomial $\sigma(x)=\sigma_e(x)$ and the error evaluator polynomial $\omega(x)=\omega_e(x)$. When the initial value is $\sigma_0(x)=\lambda(x)$, the final result polynomial derived from the formulas (15) and (16) is $\lambda(x)\cdot\sigma_e(x)$. Thus, hereinlater, $\tau(x)=\lambda(x)\cdot\sigma(x)$ is referred to as the error and erasure locator polynomial.

In the present embodiment the polynomial processing circuits 4a and 5a output the error evaluator polynomial $\omega(x)$, the error and erasure locator polynomial $\tau(x)$ and the differentiation of the error and erasure locator polynomial $\tau(x)$ and they are inputted to the polynomial processing circuits 6a, 6g and 6f of the correction circuit 12, respectively.

The error and erasure locator polynomial $\tau(x)=\lambda(x)\cdot\sigma(x)$ is $\lambda(\alpha^i)=0$ at the erasure location and $\sigma(\alpha^i)=0$ at the error location. Thus, $\tau(\alpha^i)=0$ at the error and erasure location so that the erasure location and the error location can be determined.

The differentiation of the error and erasure locator polynomial $\tau(x)=\lambda(x)\cdot\sigma(x)$ is represented by the following formula (17):

$$\tau'(x)=\lambda'(x)\cdot\sigma(x)+\lambda(x)\cdot\sigma'(x) \qquad (17)$$

At the erasure location, $\lambda(\alpha^i)=0$. Thus, from the formula (17), $\tau'(\alpha^i)=\lambda'(\alpha^i)\cdot\sigma(\alpha^i)$ and the following formula (18) is derived from the formula (13).

$$E_i=\omega(\alpha^i)/\tau'(\alpha^i) \qquad (18)$$

At the error location, $\sigma(\alpha^i)=0$. Thus, from the formula (17), $\tau'(\alpha^i)=\lambda(\alpha^i)\cdot\sigma'(\alpha^i)$ is derived and the following formula (19) is derived from the formula (12).

$$e_i=\omega(\alpha^i)/\tau'(\alpha^i) \qquad (19)$$

In this manner, by using the error and erasure locator polynomial, the error value $e_i$ and the erasure value $E_i$ are calculated by the error evaluator polynomial $\omega(x)$ and the differentiation of the erasure locator polynomial $\tau(x)$. In the present embodiment, the polynomial processing means 6a, 6f and 6g and the correction circuit 7 form the correction circuit 12, and the error value and the erasure value are calculated by the same formula $p_i=\omega(\alpha^i)/\tau'(\alpha^i)$, and if the error locator polynomial $\sigma(\alpha^i)$ is 0, it is determined that an error occurred at the i-th symbol $R_i$ of the received word and the correction value $p_i$ is added to the i-th symbol $R_i$ of the received word to correct the error, and the erasure value $E_i$ is filled at the erasure location to correct the received word.

In the correction circuit 7 of the present embodiment, as shown in FIG. 3, when an input from a terminal t2 to a switch 17 is 0 at the error and erasure location, a multiplication circuit 16 (terminal t1) is selected as the output. From the terminal t1, the differentiation $\tau'(\alpha^i)$ is inputted to a reciprocal generator circuit 15 and it is multiplied by $\omega(\alpha^i)$ by a multiplier circuit 16 to produce a product $\omega(\alpha^i)/\tau(\alpha^i)$ to determine the correction value $p_i$. The correction value $p_i$ is added to the i-th symbol $R_i$ of the received word by an adder 18. When the input from the terminal 12 is other than 0, the switch 17 is switched to output 0, and the symbol $R_i$ is outputted as it is in the adder 18.

In the present embodiment, the processing of the erasure locator polynomial operation circuit 2 and the operation circuit 2b, the processing of the polynomial operation circuits 4a and 5a, and the processing of the polynomial processing circuits 6a, 6f and 6g of FIG. 1 can be concurrently carried out. Thus, the pipeline processing as shown in FIG. 4 can be carried out for the continuously transmitted received words (messages 1, 2, 3, . . . ). In actual, a memory M is provided as shown in FIG. 2, and the memory M receives the received word in synchronism with the processing of the syndrome polynomial operation circuit 1 and outputs it in synchronism with the processing of the correction circuit 7 to carry out the decoding operation at a high speed on real time basis.

In general, the processing time of the syndrome polynomial operation circuit 1, the polynomial processing circuits 6a, 6f and 6g and the correction circuit 7 depends on the code length n, and the processing time of the erasure locator polynomial operation circuit 2 and the polynomial operation circuits 4a and 5a depends on a minimum distance d. In the present embodiment, since all of the processing are pipelined, the high speed read time decoding is attained in the encoded word having the code length of $n \geq d-1$ (all encoded words and shortened encoded words).

Figure 11A:
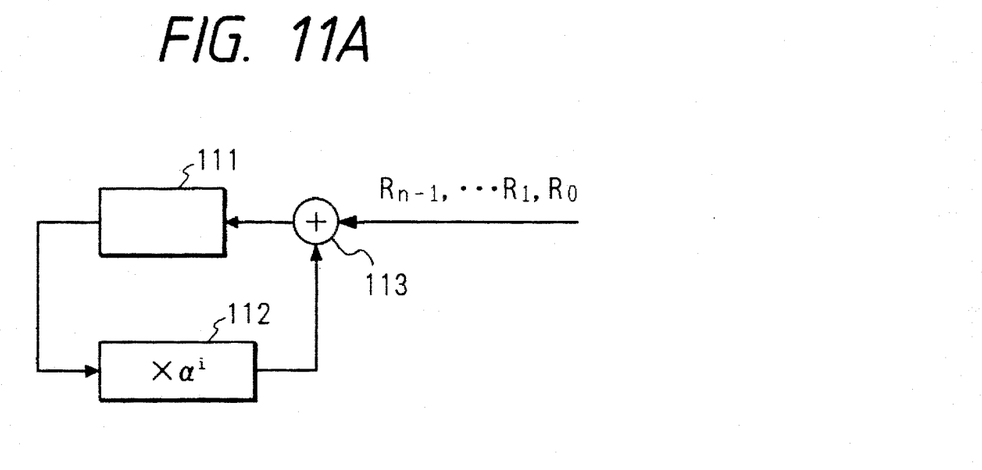
FIGS. 11A and 11B show block diagrams of configurations of a syndrome generator circuit and a polynomial processing circuit.

FIG. 11A shows a configuration of the syndrome polynomial operation circuit 1. A memory element 111 stores a sum of an adder 113. A multiplier 112 multiplies the content read from the memory element 111 by $\alpha^i$. The adder adds a new received word to the product of the multiplier 112. By setting $\alpha^k$ as the multiplier of the multiplier 112, $S_{k-1}$ of the formula (7) which is a coefficient of the syndrome polynomial is calculated. In order to attain all coefficients, the circuit of FIG. 11A may be provided for each k.

Figure 11B:
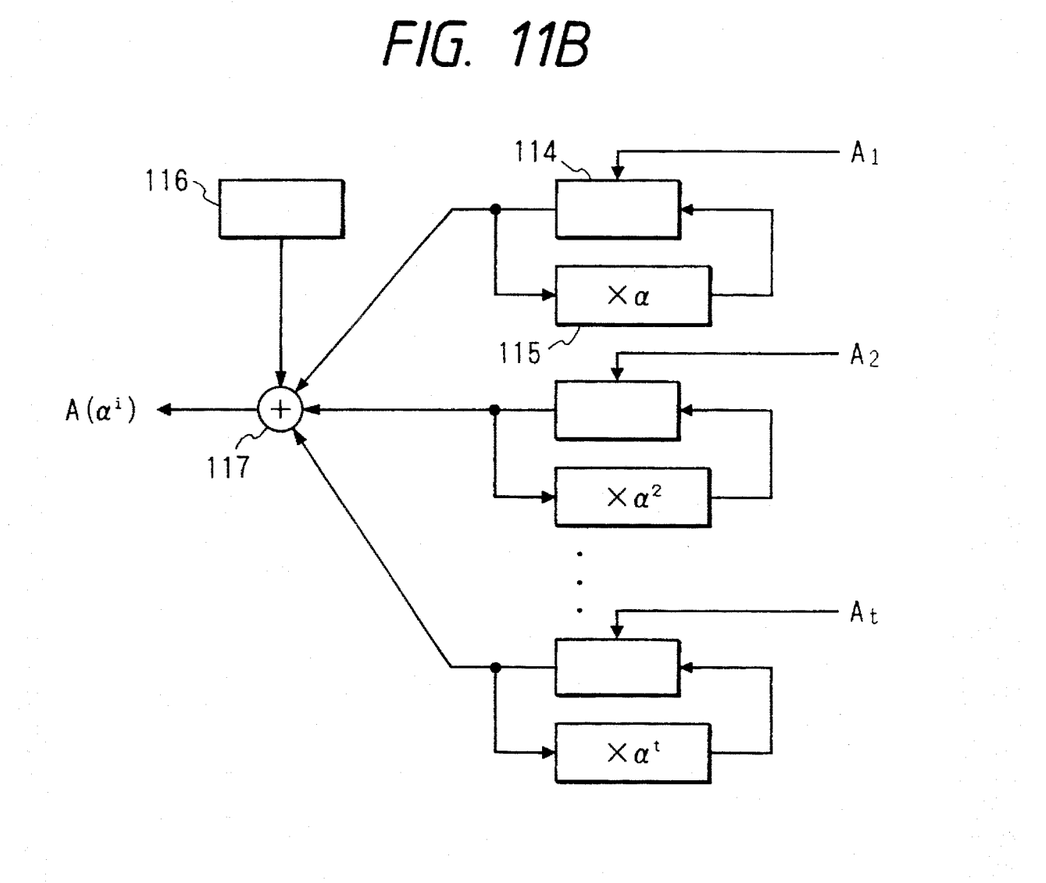

FIG. 11B shows a configuration of the polynomial processing circuits 6a, 6f and 6g. It shows a circuit for determining a value $A(\alpha^i)$ derived by setting $\alpha^i$ to a polynomial $A(x)=1+A_1x+A_2x^2; \ldots A_rx^r$. $A_i$ is set in the memory element 114 and the multiplier 112 multiplies $A_1$ read from the memory element 111 by $\alpha$. Same is true for other $A_j$. The memory element 116 outputs 1. The output of the adder 117 after i shifts is $A(\alpha^i)$. When the polynomial processing circuit 6g determines $\tau(\alpha^i)-1=-1$ in place of $\tau(\alpha^i)=0$, the memory element 116 is not necessary.

Specific configurations of the erasure locator polynomial operation circuit 2, the operation circuit 2b and the polynomial operation circuits 4a and 5a may be those disclosed in U.S. Pat. No. 5,325,373.

In accordance with the present embodiment, the operation is conducted by the operation circuit 2b of the same configuration as that of the erasure locator polynomial operation circuit 2 with the initial value of the erasure locator polynomial $\lambda(x)$ being the syndrome polynomial $S(x)$, the circuit scale can be reduced and the processing speed can be increased in the polynomial operation circuits 4a and 5a, the error locator polynomial $\omega(x)$, the error and erasure locator polynomial $\tau(x)=\lambda(x)\cdot\sigma(x)$ and the differentiation $\tau'(x)$ of the error and erasure locator polynomial $\tau(x)$ are operated in the Euclidean algorithm. Thus, the number of operands can be reduced and the circuit scale of the polynomial operation circuits 4a and 5a can also be reduced and the processing speed is increased. The correction circuit 12 operates the error locator polynomial $\omega(x)$, the error and erasure locator polynomial $\tau(x)=\lambda(x)\cdot\sigma(x)$ and the differentiation $\tau'(x)$ of the error and erasure locator polynomial $\tau(x)$ so that the processing of the three polynomial processing circuits 6a, 6f and 6g can be carried out, and the circuit scale is reduced and the processing speed is increased. Thus, the overall circuit scale is significantly reduced compared to that prior art apparatus and the decoding including the error correction as well as the erasure correction can be attained at a high speed on real time basis.

[Second Embodiment]

Figure 5:
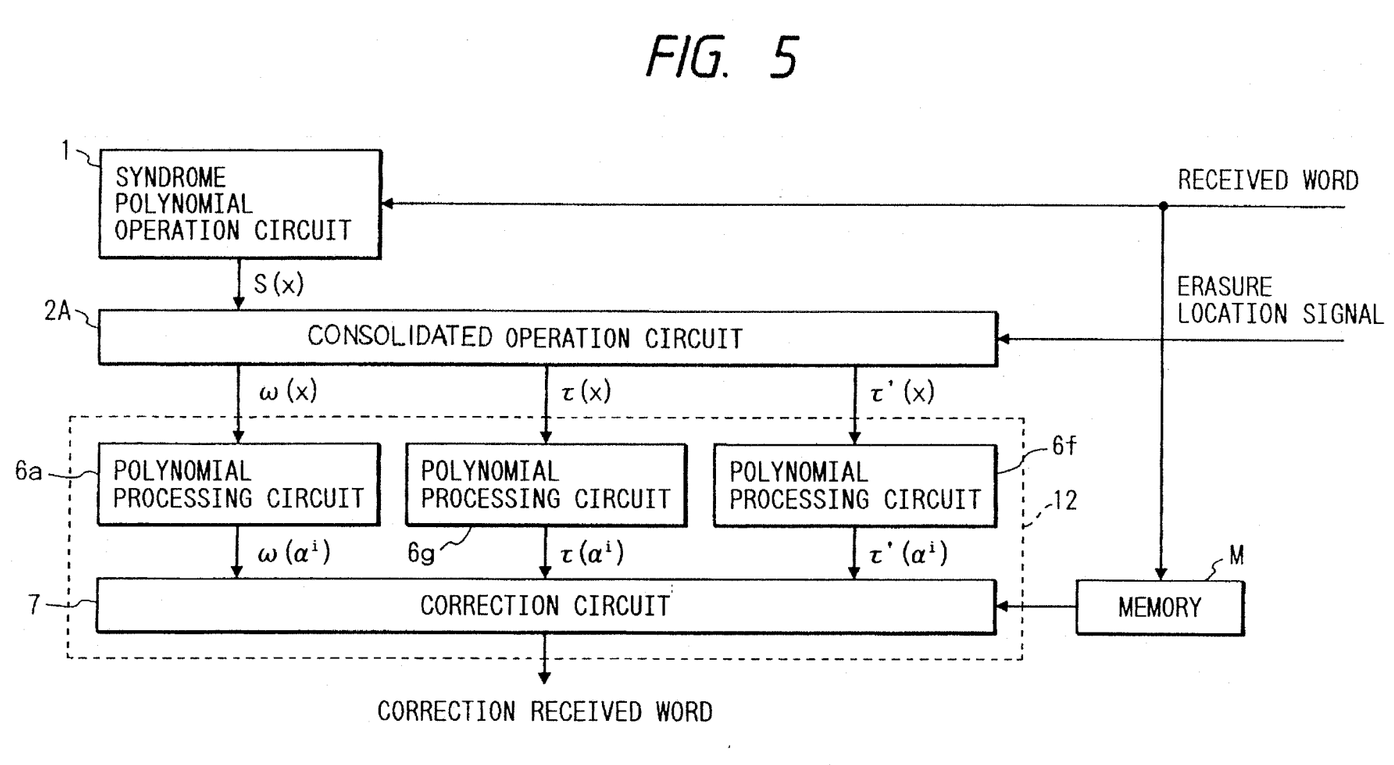
FIG. 5 shows a block diagram of a configuration of the error correction circuit of the first embodiment.
Figure 6:
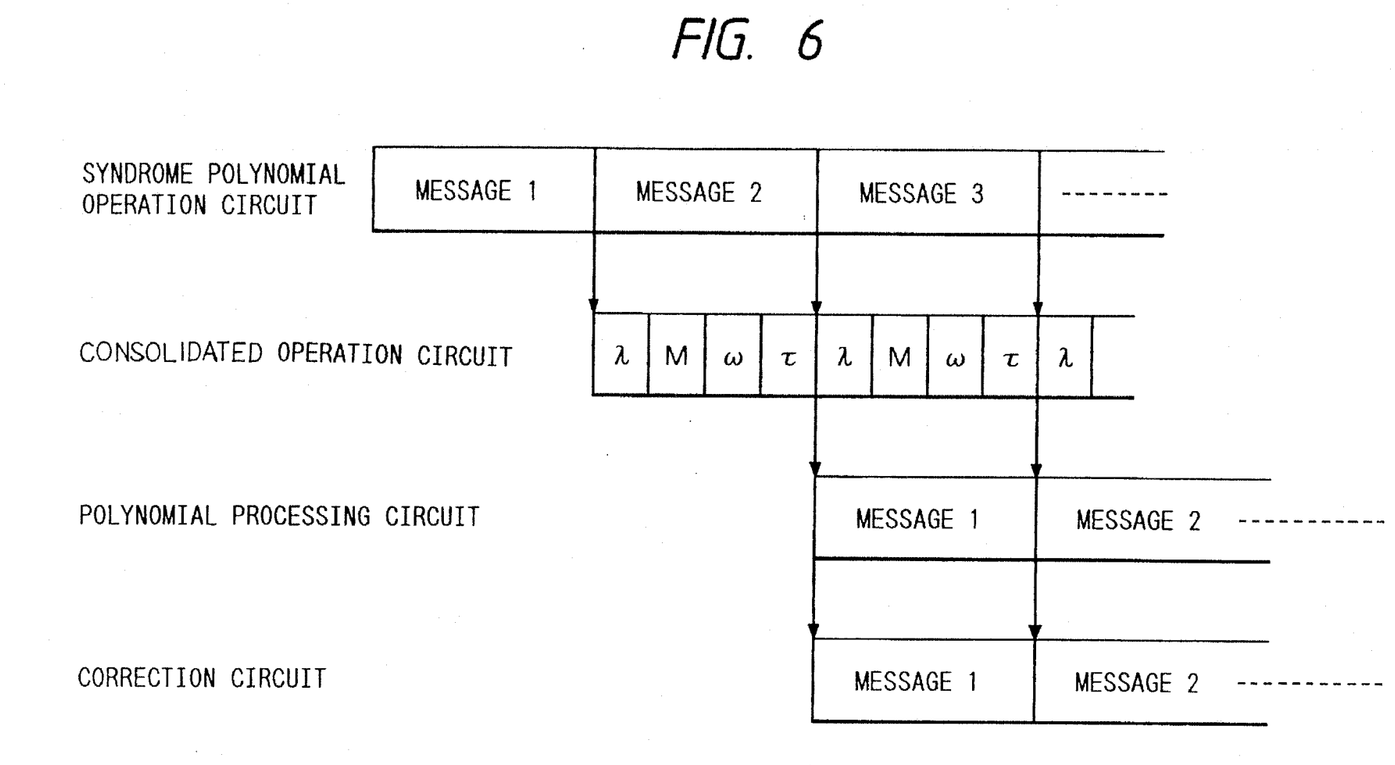
FIG. 6 illustrates an operation of a second embodiment.

Referring to FIGS. 5 and 6, a second embodiment of the present invention is explained. FIG. 5 shows a block diagram of a configuration of the second embodiment and FIG. 6 illustrates an operation of the second embodiment.

In the present embodiment, as shown in FIG. 5, the processing of the operation circuit 2b, the erasure locator polynomial operation circuit 2 and the polynomial operation circuits 4a and 5a is carried out by one consolidated operation circuit 2A. As described above, the processing time of the erasure locator polynomial operation circuit 2 and the polynomial operation circuits 4a and 5a depends on the minimum distance d, and the code length n actually used is sufficiently larger than the minimum distance d. Thus, if the code length is $n \geq 4(d-1)$, the high speed real time decoding may be attained without pipelining the operation circuit 2b, the erasure locator polynomial operation circuit 2 and the polynomial operation circuits 4a and 5a by a separate circuit as it is in the first embodiment. In this case, as shown in FIG. 6, the operation of the product polynomial M, the operation of the erasure locator polynomial $\lambda$ and the processing of the Euclidean algorithm of the polynomial (operation of $\omega$, $\tau$ and $\tau'$) can be concurrently carried out.

A specific configuration of the consolidated operation circuit 2A may use a circuit disclosed in Japanese Patent Application Laid-Open Nos. 63-233613 and 63-233614.

In accordance with the present embodiment, the circuit scale can be further reduced and the processing of error correction and erasure correction equivalent to that of the first embodiment is attained.

[Other Embodiment]

In the first embodiment, the polynomial processing circuits are reduced to the three circuits 6a, 6f and 6g compared to the prior art configuration shown in FIG. 10 by (1) replacing the product polynomial operation circuit 3 by the operation circuit 2b, (2) replacing the polynomial operation circuit 5 for calculating $\sigma(x)$ and $\sigma'(x)$ by the polynomial operation circuit 5a for calculating $\tau(x)(=\sigma(x)\cdot\lambda(x))$ and $\tau'(x)$, and (3) determining the error and erasure location by $\tau(\alpha^i)=0$ and the error value $e_i$ and the erasure value $E_i$ by $\omega(\alpha^i)/\tau'(\alpha^i)$ although the present invention is not limited thereto and one or two of the processes (1), (2) and (3) may be carried out. When the process (2) is not carried out, $\sigma(x)$ may be determined in the conventional manner and it may be multiplied by $\lambda(x)$ to produce $\tau(x)$ $(=\sigma(x)\cdot\lambda(x))$.

In the decoder which carries out the erasure correction, it has been known to use the erasure location as the location of the check symbol (parity bit). Thus, the present invention may be used as the decoder as well as the encoder or the encoder/decoder. In the preferred embodiments, b=0 in the generator polynomial although the present invention is not limited thereto but b may be any integer in the generator polynomial. In the preferred embodiments, the operation of the error evaluator polynomial and the error and erasure locator polynomial uses the Euclidean algorithm although the present invention is not limited thereto but a Burencup Maasay method or a Peterson method may be used.

Although the present invention has been described in its preferred form with a certain degree of particularity, many apparently widely different embodiments of the invention may be made without departing from the spirit and scope thereof. It is to be understood that the invention is not limited to the specific embodiments thereof except as defined in the appended claims.

What is claimed is:

1. An apparatus for correcting erasure and error of a received word comprising:

syndrome polynomial generation means for generating a syndrome polynomial based on the received word;

erasure locator polynomial generation means for generating an erasure locator polynomial based on an erasure location;

first product polynomial generation means for generating a first product polynomial which is a product of the syndrome polynomial and the erasure locator polynomial;

error evaluator polynomial generation means for generating an error evaluator polynomial based on the first product polynomial;

second product polynomial generation means for generating a second product polynomial which is a product of the erasure locator polynomial and the error locator polynomial and a differentiation of the second product polynomial;

first numeric operation means for producing the value of differentiation of the second product polynomial with a specific dimension;

second operation means for producing a value of the error evaluator polynomial with a specific dimension;

third operation means for producing a value of the second product polynomial with a specific dimension;

fourth numeric operation means for dividing the operation result of said first numeric operation means by the operation result of said second numeric operation means;

determination means for determining whether the operation result of said third numeric operation means is a predetermined value; and correction means for setting the dimension corresponding to the location of the symbols of the received word to said first to third numeric operation means, and when the predetermined value is detected by said determination means, correcting the corresponding symbol by using the operation result of said fourth numeric operation unit.

2. An apparatus according to claim 1 wherein the dimensions corresponding to the location of the symbols of the received word are sequentially set to said first to third numeric operation means, and the symbols of the received word are sequentially inputted to said correction means and said correction means corrects the symbols or sequentially output as they are.

3. An apparatus according to claim 2 further comprising memory means for storing the received word in parallel to said syndrome polynomial generation means, said received word being read out by said correction means.

4. An apparatus according to claim 1 wherein said first product polynomial generation means generates an erasure locator polynomial having the syndrome polynomial generated by said syndrome polynomial generation means as an initial value, as the first polynomial based on the erasure location.

5. An apparatus according to claim 4 wherein said erasure locator polynomial generation means and said first product polynomial generation means generates erasure locator polynomials with different initial values by a common operation circuit.

6. An apparatus according to claim 1 wherein said second product generation means operates the error locator polynomial having the erasure locator polynomial generated by said erasure locator polynomial generation means as an initial value, as the second product polynomial by a Euclidean algoithm.

7. An apparatus according to claim 1 wherein at least two of said erasure locator polynomial generation means, said first product polynomial generation means, said error evaluator polynomial generation means and said first product polynomial generation means use a common operation circuit.

8. An apparatus according to claim 1 wherein said predetermined value is zero.

* * * * *

UNITED STATES PATENT AND TRADEMARK OFFICE
CERTIFICATE OF CORRECTION

PATENT NO.  : 5,541,937

DATED       : July 30, 1996

INVENTOR(S) : KEIICHI IWAMURA

Page 1 of 2

It is certified that error appears in the above-identified patent and that said Letters Patent is hereby corrected as shown below:

COLUMN 1

Line 10, "occured" should read --occurring--.
Line 16, "occurred" should read --occurring--.
Line 23, "Recently," should read
         --Recently, a demand has arisen for--.
Line 24, "is demanded" should be deleted.

COLUMN 2

Line 33, "actual," should read --actual practice,--.
Line 52, "decode," should read --decoder,--.

COLUMN 6

Line 66, "actual," should read --actual practice,--.

COLUMN 7

Line 28, "$A_t x^t . A_i$" should read --$A_t x^t \cdot A_i$--.

UNITED STATES PATENT AND TRADEMARK OFFICE
CERTIFICATE OF CORRECTION

PATENT NO.  : 5,541,937
DATED       : July 30, 1996
INVENTOR(S) : KEIICHI IWAMURA It is certified that error appears in the above-identified patent and that said Letters Patent is hereby corrected as shown below:

<u>COLUMN 10</u>

```
    Line 5, "output" should read --outputs them--.
    Line 26, "algolithm." should read --algorithm.--.
```

Signed and Sealed this

Eighteenth Day of February, 1997

Attest:

BRUCE LEHMAN

*Attesting Officer*          *Commissioner of Patents and Trademarks*